United States Patent [19]

Oudar

[11] Patent Number: 5,809,051
[45] Date of Patent: Sep. 15, 1998

[54] VERTICAL CAVITY LASER EMISSION COMPONENT THAT EMITS VIA THE SURFACE AT A WAVELENGTH LYING IN THE RANGE 1.3 MICROMETERS TO 1.55 MICROMETERS AND A METHOD FOR MAKING IT

[75] Inventor: Jean-Louis Oudar, Chatenay-Malabry, France

[73] Assignee: France Telecom, France

[21] Appl. No.: 717,000

[22] Filed: Sep. 20, 1996

[30] Foreign Application Priority Data

Sep. 22, 1995 [FR] France ................................ 95 11158

[51] Int. Cl.$^6$ ................................ H01S 3/19; H01S 3/08
[52] U.S. Cl. ................................ 372/45; 372/46; 372/96
[58] Field of Search ................................ 372/92, 96, 99, 372/45, 46; 257/98, 94, 96

[56] References Cited

U.S. PATENT DOCUMENTS

| | | | |
|---|---|---|---|
| 5,063,569 | 11/1991 | Xie | 372/45 |
| 5,493,577 | 2/1996 | Choquette et al. | 372/96 |

OTHER PUBLICATIONS

Electronics Letters, vol. 30, No. 9, Apr. 28, 1994, pp. 704–706 Babic et al "Optically Pumped All–Epitaxial Wafer–Fused 1.52 µm Vertical–Cavity Lasers".

Journal of Lightwave Technology, vol. 4, No. 7, Jul. 1986, pp. 846–850 Uchiyama et al "GaInAsP/InP Surface–Emitting Lasers With Current Confining Structure".

Electronics Letters, vol. 29, No. 10, May 13, 1993, pp. 913–914 Baba et al "Threshold Reduction of 1.3 µm GalnAsP/InP Surface Emitting Laser by a Maskless Circular Planar Buried Heterostructure Regrowth".

Applied Physics Letters, vol. 65, No. 1, Jul. 4, 1994, Woodbury, US, pp. 97–99 Huffaker et al "Native–Oxide Defined Ring Contact For Low Threshold Vertical Cavity Lasers".

Electronics Letters, vol. 31, No. 11, May 25, 1995, pp. 886–888 Yang et al. "UltraLow Threshold Current Vertical–Cavity Surface Emitting Lasers Obtained With Selective Oxidation".

Applied Physics Letters, vol. 64, No. 12, Mar. 21, 1994, pp. 1463–1465 Dudley et al, "Low Threshold, Wafer Fused Long Wavelength Vertical Cavity Lasers".

Materials, Science and Engineering B28 (1994), pp. 289–292 Streubel et al (No Month Available).

Applied Physics Letters, vol. 66, No. 9, Feb. 27, 1995, pp. 1030–1032 Babic et al "Double–Fused 1.52 µm Vertical Cavity Lasers".

Electronics Letters, vol. 30 No. 24, Nov. 24, 1994, pp. 2043–2044 Choquette et al "Low Threshold Voltage Vertical–Cavity Lasers Fabricated by Selective Oxidation".

*Primary Examiner*—Rodney B. Bovernick
*Assistant Examiner*—Quyen Phan Leung
*Attorney, Agent, or Firm*—Blakely, Sokoloff, Taylor & Zafman

[57] ABSTRACT

A vertical cavity laser emission component emitting via the surface at a wavelength lying in the range 1.3 µm to 1.55 µm, the component comprising a stack having two mirrors which reflect at the emission wavelength, plus one or more layers which are interposed between the two mirrors and which constitute an amplifying medium for the emitted radiation, wherein, in the vicinity of the amplifying medium, at least one of the mirrors presents a layer of $Al_xGa_{1-x}As$ where x lies in the range 0.8 to 1, which layer is selectively oxidized around an active central zone of the amplifying medium. In the method, two samples are grown epitaxially, one on an InP substrate and the other on a GaAs substrate, the two samples obtained in this way are assembled together by epitaxial adhesion of a GaAs layer of the second sample on an InP layer of the first sample, and the resulting sample is subsequently etched and then oxidized by hydrolysis.

13 Claims, 1 Drawing Sheet

VERTICAL CAVITY LASER EMISSION COMPONENT THAT EMITS VIA THE SURFACE AT A WAVELENGTH LYING IN THE RANGE 1.3 MICROMETERS TO 1.55 MICROMETERS AND A METHOD FOR MAKING IT

FIELD OF THE INVENTION

The present invention relates to a vertical cavity laser emission component that emits via the surface at a wavelength lying in the range 1.3 μm and 1.55 μm.

It also provides a method of making the component.

A particular application of the component of the invention lies advantageously in the field of telecommunications via optical fibers or for making high performance optical interconnections that enable information to be transferred between various elements of computer systems.

BACKGROUND OF THE INVENTION

Conventionally, a vertical cavity laser emission component is constituted by a stack comprising a bottom mirror, a cavity including the active layer(s) constituting the amplifying medium for laser radiation, and a top mirror.

The bottom and top mirrors are generally constituted by stacking "quarterwave" layers, made either of doped semiconductor materials or else of insulating dielectric materials. Such stacks of quarterwave layers provide Bragg reflectors centered on the operating wavelength of the component.

The cavity includes, optionally in the form of quantum wells, one or more layers of semiconductor materials of absorption band wavelength (corresponding to the energy of the forbidden band) close to that of the laser radiation.

Most vertical cavity lasers that have been made until now and that are capable of operating continuously at ambient temperature have been made out of an AlGaAs or InGaAs active medium grown epitaxially on GaAs, and they emit at wavelengths shorter than 1 μm.

Vertical cavity lasers emitting via the surface at wavelengths lying in the range 1.3 μm to 1.55 μm have already been proposed. Their active layers are layers of InGaAsP or InGaAsAl alloy grown epitaxially on an InP substrate.

Nevertheless, so far, none of the structures that have been proposed with active layers of that type is satisfactory for continuous operation at ambient temperature.

In particular:

[1] T. Baba et al., in Electron. Lett. 29, 913 (1993), have described a vertical cavity component whose mirrors are completely insulating dielectric mirrors. The structure described in that article has the drawbacks of quite high energy dissipation due to the injection current passing through very thin semiconductor layers and of a high temperature rise due to the poor thermal conductivity of the dielectric mirrors. As a result, continuous operation could be obtained only for temperatures up to 14° C.

Proposals have also been made, in particular in:

[2] K. Streubel et al., Mater. Science and Engineer, B28, 289 (1994) to use mirrors made of InGaAsP/InP. Because the difference in refractive index between the two layers constituting the Bragg reflector is too small, the reflectivity of those mirrors is not sufficient to obtain the laser effect continuously.

More recently, proposals have been made to use one or even two Bragg reflectors of AlAs/GaAs bonded to the active medium by epitaxial adhesion. In this respect, reference may advantageously be made to the following publications:

[3] J. J. Dudley et al., Appl. Phys. Lett., 64, 1463 (1994);

[4] D. I. Babic et al., Appl. Phys. Lett., 66, 1030 (1995).

That approach has made it possible to achieve the laser effect at 1.55 μm under pulse conditions with threshold currents that are advantageous, but still too high to obtain continuous operation.

It is generally considered that this technique is incapable of giving rise to satisfactory components. Indeed, it is commonly accepted by the person skilled in the art that making GaAs/InP junctions by epitaxial adhesion gives rise to a considerable potential barrier between the two materials which must impede the passage of electricity and give rise to heating of the structure, thereby reducing the chances of obtaining the looked-for laser operation.

OBJECT AND SUMMARY OF THE INVENTION

The main aim of the invention is therefore to propose a vertical cavity laser component emitting via the surface that is capable of operating continuously at ambient temperature at wavelengths lying in the range 1.3 μm to 1.55 μm.

The following publications:

[5] D. L. Huffaker et al., Appl. Phys. Lett., 65, 97 (1994);

[6] K. D. Choquette et al., Electron. Lett., 30, 2043 (1994), disclose vertical cavity lasers emitting via the surface at wavelengths of 0.98 μm, and that have lateral confinement achieved by selective oxidation of the outer portion of a layer of AlAs etched to form mesas.

At present, that technique has never been used to make lasers operating in the range 1.3 μm to 1.55 μm, in particular given that a good quality layer of AlAs cannot easily be made over the active layer of a laser in this range because of the difference in the crystal lattice parameters which creates an array of dislocations giving rise to losses and to heating of the structure that oppose obtaining the laser effect.

The invention provides a vertical cavity laser emission component emitting via the surface at a wavelength lying in the range 1.3 μm to 1.55 μm, the component comprising a stack having two mirrors which reflect at the emission wavelength, plus one or more layers which are interposed between the two mirrors and which constitute an amplifying medium for the emitted radiation, wherein, in the vicinity of the amplifying medium, at least one of the mirrors presents a layer of $Al_xGa_{1-x}As$ where x lies in the range 0.8 to 1, which layer is selectively oxidized around an active central zone of the amplifying medium.

Such a component presents lateral confinement of the electrical current due to the insulating character of the oxide layer, combined with lateral confinement of the optical mode of the vertical cavity due to its refractive index, which is considerably smaller than that of the non-oxidized central zone.

As a result, in operation, the active zone is subject to little heating, thereby enabling operation to take place continuously at ambient temperature.

The invention also provides a method of making such a component, comprising the following steps:

firstly, on an InP substrate, epitaxially growing a stack comprising the following layers in succession:
  an N-doped InP layer;
  one or more layers constituting the medium for amplifying the emitted radiation;
  a P-doped InP layer; and
  an InGaAsP terminal layer;
secondly, on a GaAs substrate, epitaxially growing a stack including at least one layer of $Al_xGa_{1-x}As$ with x lying in the range 0.8 to 1, plus a terminal layer of GaAs;

assembling together the two samples obtained in this way by heat treatment achieving epitaxial adhesion of the GaAs layer of the second sample to an InP layer of the first sample;

selectively etching mesas so that the layer at the surface of the sample between the mesas is the $Al_xGa_{1-x}As$ layer;

oxidizing the $Al_xGa_{1-x}As$ layer by hydrolysis for a length of time such that, at the end of said oxidation, said layer is selectively oxidized around an active central zone of the amplifying medium; and metallizing the top faces of the mesas.

BRIEF DESCRIPTION OF THE DRAWING

Other characteristics and advantages of the invention appear further from the following description.

The description is purely illustrative and non-limiting. It should be read with reference to the accompanying drawing, in which.

MORE DETAILED DESCRIPTION

Figure 1:
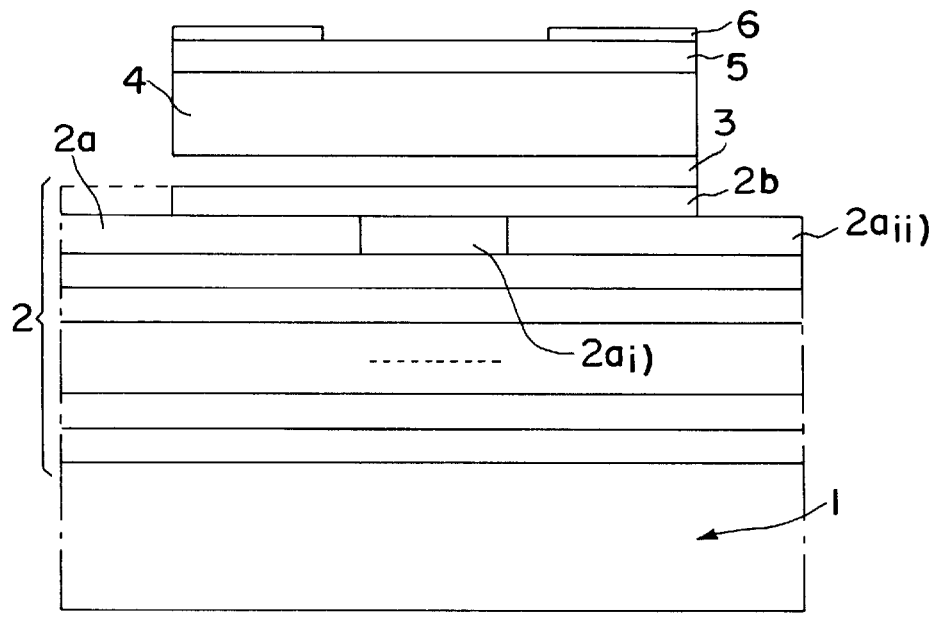
FIG. 1 is a diagrammatic section view of a component comprising a first possible embodiment of the invention.

The component shown in FIG. 1 is constituted, on an N-doped GaAs substrate 1, by a stack of the following layers in succession:

a plurality of AlAs/GaAs layers defining a Bragg mirror 2;

an N-doped InP layer 3;

one or more layers constituting the medium 4 that amplifies the emitted radiation;

a P-doped InP layer 5; and a metal deposit 6.

The layers 3 to 6 plus the GaAs layer 2b of the mirror 2 which is directly juxtaposed to the layer 3 define a cylindrical mesa carried by the substrate 1 and the remainder of the mirror 2.

The amplifying medium 4 is not intentionally doped. By way of example, it may be constituted by a layer of InGaAsP or by a quantum well structure $(InGaAsP)_1/(InGaAsP)_2$. Naturally, it is also possible to use other active materials conventionally used as laser materials in the wavelength range 1.3 μm–1.55 μm.

The AlAs and GaAs layers of the mirror 2 are quarterwave layers having individual thicknesses of λ/4n, where λ is the laser emission wavelength and n is the refractive index at that wavelength.

These layers are N type, with doping that varies so as to minimize parasitic electrical resistances such as those which appear at the interfaces between low and high index materials, and so as to obtain simultaneously low optical losses by absorption on the free carriers due to the doping.

For example, the doping is chosen to be greater in the vicinity of the GaAs/AlAs interface to facilitate the passage of electrical current through the interface.

In a variant, it is possible to adopt a gradual transition between the GaAs and AlAs layers by causing the concentration of aluminum to vary progressively.

The number of pairs of AlAs/GaAs layers must be sufficient to achieve reflectivity in excess of 99% (typically 25 to 30 pairs are necessary).

In accordance with the invention, one of the AlAs layers of the mirror 2 in the vicinity of the amplifying medium 4 is selectively oxidized (the layer 2a adjacent to the above-mentioned layer 2b of GaAs): its central portion $2a_i$ in register with the active zone of the amplifying medium 4 is not oxidized and it is surrounded by an oxidized ring $2a_{ii}$).

This selectively oxidized structure provides a high degree of lateral confinement of the injection current, and also a high degree of optical confinement of the emitted beam.

The metallized layer 6 serves both as an electrical contact and as a reflector.

It may cover the mesa entirely, in which case laser output takes place through the substrate 1.

It may equally well be annular in shape as shown in FIG. 1, thereby allowing light to escape from the top. Under such circumstances, the top mirror 6 may optionally be associated with a conventional multilayer dielectric deposit to improve its reflectivity.

The method of making the FIG. 1 component is described below.

Initially, two epitaxial growth operations are performed, one on an InP substrate and the other on a GaAs substrate.

The following are deposited in succession on the InP substrate:

a stop layer of InGaAsP (not shown);

the layer 5 of InP;

the amplifying medium 4;

the layer 3 of InP; and a terminal layer of InGaAsP.

The stack of AlAs/GaAs layers for the mirror 2 is grown by epitaxy on the N type GaAs substrate 1.

After the epitaxial growth has been performed, the two resulting samples are assembled together by epitaxial adhesion as follows.

Firstly the InGaAsP terminal layer is removed by selective chemical etching, e.g. using a solution based on sulfuric acid and oxygenated water.

Then, the surfaces of the two samples are deoxidized, rinsed, dried, and placed in a graphite sample carrier which holds them one against the other with uniform pressure.

The assembly is placed in an oven which is initially purged with nitrogen, and then maintained in a hydrogen atmosphere and subjected to a temperature of 630° C. for 30 minutes.

After returning to ambient temperature, the sample carrier is withdrawn from the oven and epitaxial adhesion is terminated.

After this operation, two selective chemical etching operations are performed firstly to remove the InP substrate and secondly to remove the InGaAsP stop layer.

Thereafter, the sample is prepared for mesa etching using techniques that are conventionally known to the person skilled in the art.

For example, a dielectric layer and then a photosensitive resin are deposited on the layer 5.

The resin is exposed through a mask defining the shape of the mesas (e.g. disks having a diameter of 50 μm), with each of the mesas corresponding to an individual laser.

After the resin has been developed, a first reactive ion etching operation transfers the resin pattern onto the dielectric layer, which then serves as a mask for etching the layers grown epitaxically on InP.

This second etching operation is performed under conditions that make it possible to stop at the first N-doped GaAs layer (layer 2b). A final selective etching operation is performed to remove said layer of GaAs, e.g. by dipping the sample in a solution of succinic acid at a pH of 4.3 and maintained at a temperature of 50° C. The material that remains at the surface of the sample between the mesas is the material constituting the AlAs layer 2a.

The sample is then subjected to a step of oxidation by hydrolysis, of the type described in above-mentioned references [5] and [6].

The surface layer 2a of AlAs is oxidized by placing the sample for about 3 minutes in an oven maintained at 475° C. The atmosphere in the oven is constituted by a flow of nitrogen that has bubbled through deionized water heated to 95° C. The oxidation $2a_{ii}$) of the AlAs layer progresses laterally in annular manner by diffusion beneath the mesas.

The oxidized layer can be said to be "buried" beneath the mesa. The oxidized ring $2a_{ii}$) made in this way causes the laser injection current to pass through the non-oxidized N type AlAs central portion $2a_i$). The size of the central portion $2a_i$) is adjusted by varying the time spent in the oven. It should also be observed that the oxidized ring $2a_{ii}$) maintains good electrical insulation between the individual lasers.

The electrical contact layer 6 is then deposited by metallizing the top of the mesa on the P type InP layer 5.

In the embodiment shown in FIG. 1, an opening having a diameter of 15 $\mu$m is formed through the metal layer in the center of each mesa so as to enable the laser radiation to escape.

The vertical cavity is finished off by depositing a multilayer stack constituting the top mirror, e.g. a stack of alternating $SiO_2/TiO_2$ deposited cold by means of evaporation assisted by ion bombardment.

Figure 2:
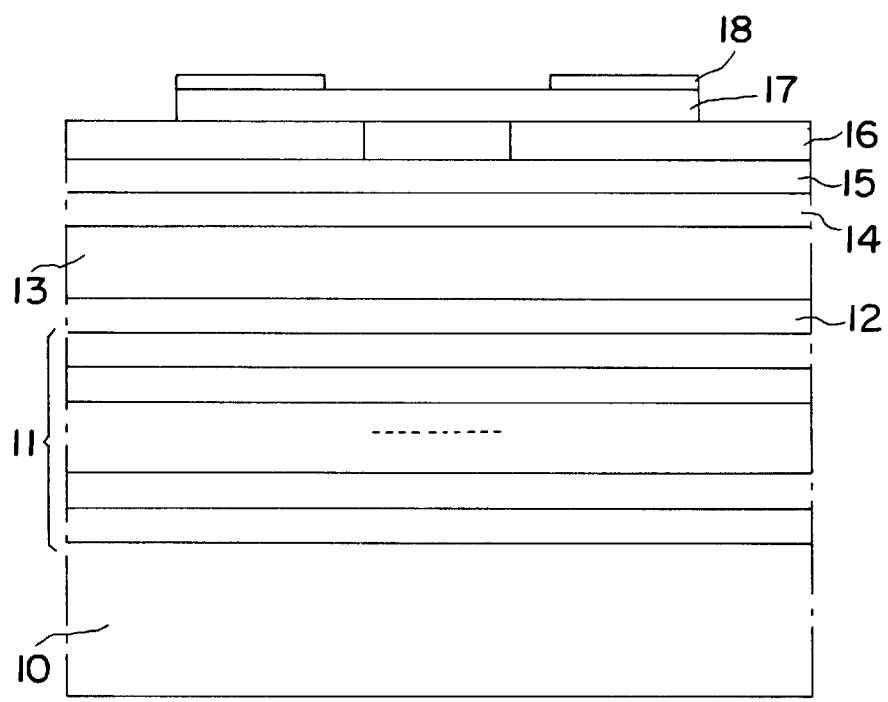
FIG. 2 is a diagrammatic section view of a component comprising a second possible embodiment of the invention.

Another possible embodiment of the invention is shown in FIG. 2.

On an N-doped InP substrate 10, this embodiment is constituted by the following layers in succession:
 a plurality of N type layers grown epitaxially on the substrate 10 and defining a Bragg mirror 11;
 an N-doped Inp layer 12;
 one or more layers defining the amplifying medium 13 of the component;
 a P-doped InP layer 14;
 a doped GaAs layer 15;
 a selectively oxidized AlAs layer 16;
 a doped GaAs layer 17; and
 a top layer of metallization 18 optionally finished off by depositing a multilayer dielectric.

To make this component, two epitaxial growth operations are performed initially: one on the substrate 10; and the other on a GaAs substrate.

On the N type InP substrate 10, the various different layers defining the Bragg reflector 11, the N type InP layer 12, the amplifying medium 13, the P type InP layer 14, and a terminal layer of InGaAsP (not shown) are grown in succession.

On the GaAs substrate, four P type layers are grown in succession, namely a stop layer of AlAs or of AlGaAs, the layer 17 of GaAs, the layer 16 of AlAs which is to be oxidized selectively, and a terminal layer corresponding to the layer 15 of GaAs.

The two samples obtained in this way are caused to adhere epitaxially in the same manner as that described with reference to the embodiment of FIG. 1.

Thereafter, the GaAs substrate and the top layer are removed by selective chemical etching.

The appropriate operations are performed for etching mesas on the GaAs layer. This etching is much shallower than in the first example, and it can be performed merely by dipping the sample in a solution of succinic acid at pH 4.3 maintained at a temperature of 50° C.

The material remaining at the surface of the sample between the mesas is then AlAs.

Thereafter the operation of oxidation by hydrolysis is performed as described above, after which metallization is performed while maintaining a central opening, and then the top dielectric mirror is deposited.

I claim:

1. A vertical cavity laser emission component emitting via the surface at a wavelength lying in the range 1.3 $\mu$m to 1.55 $\mu$m, the component comprising a stack having two mirrors which reflect at the emission wavelength, plus one or more layers which are interposed between the two mirrors and which constitute an amplifying medium for the emitted radiation, wherein, in the vicinity of the amplifying medium, at least one of the mirrors presents a layer of $Al_xGa_{1-x}As$ where x lies in the range 0.8 to 1, which layer is selectively oxidized around an active central zone of the amplifying medium.

2. A component according to claim 1, wherein the selectively oxidized layer is a layer of AlAs.

3. A component according to claim 2, comprising, on a substrate of N-doped GaAs, a stack of the following layers in succession:
 a plurality of AlAs/GaAs layers defining a Bragg mirror;
 an N-doped InP layer;
 one or more layers constituting the medium for amplifying the emitted radiation;
 a P-doped InP layer; and
 a metal deposit;
the oxidized layer being the AlAs layer of the Bragg mirror closest to the amplifying medium, the layers between said oxidized layer and the metal deposit being etched into mesas.

4. A component according to claim 3, wherein the metal deposit has a hole for passing the emitted light and is finished off with a multilayer dielectric deposit.

5. A component according to claim 2, comprising, on an N-doped InP substrate, a stack of the following layers in succession:
 a plurality of N type layers defining a Bragg mirror;
 an N-doped InP layer;
 one or more layers constituting the medium for amplifying the emitted radiation;
 a P-doped InP layer;
 a P-doped GaAs layer;
 a selectively oxidized layer of AlAs;
 a P-doped GaAs layer etched into mesas; and
 a metal deposit.

6. A component according to claim 5, wherein the metal deposit has a hole for passing the emitted light and is finished off with a multilayer dielectric deposit.

7. A method of making a component according to claim 1, comprising the following steps:
 firstly, on an InP substrate, epitaxially growing a stack comprising the following layers in succession:
  an N-doped InP layer;
  one or more layers constituting the medium for amplifying the emitted radiation;
  a P-doped InP layer; and
  an InGaAsP terminal layer;
 secondly, on a GaAs substrate, epitaxially growing a stack including at least one layer of $Al_xGa_{1-x}As$ with x lying in the range 0.8 to 1, plus a terminal layer of GaAs;

assembling together the two samples obtained in this way by heat treatment achieving epitaxial adhesion of the GaAs layer of the second sample to an InP layer of the first sample;

selectively etching mesas so that the layer at the surface of the sample between the mesas is the $Al_xGa_{1-x}As$ layer;

oxidizing the $Al_xGa_{1-x}As$ layer by hydrolysis for a length of time such that at the end of said oxidation said layer is selectively oxidized around an active central zone of the amplifying medium; and metallizing the top faces of the mesas.

8. A method according to claim 7 for making the component of claim 3, wherein, on the InP substrate, the following are deposited epitaxially in succession:
an InGaAsP stop layer;
a P-doped InP layer;
the layer(s) constituting the medium for amplifying the emitted radiation;
the N-doped InP layer; and
an InGaAsP terminal layer;

on the N type GaAs substrate, the stack of AlAs/GaAs layers of the Bragg mirror is deposited epitaxially;

the InGaAsP terminal layer is removed by selective chemical etching prior to the heat treatment for epitaxial adhesion;

after the heat treatment for epitaxial adhesion, both the InP substrate and the InGaAsP stop layer are removed in two selective chemical etching operations;

the various layers between the P-doped InP layer and the first GaAs layer of the Bragg mirror are etched, with the layer at the surface of the sample between the mesas being the first AlAs layer of the Bragg mirror; and then said AlAs layer is selectively oxidized.

9. A method according to claim 7 for making the component of claim 5, wherein:

on the InP substrate, the following layers are deposited in succession:
the various layers defining the Bragg reflector;
the N type InP layer;
the layer(s) constituting the medium for amplifying the emitted radiation;
the P type InP layer; and
an InGaAsP terminal layer;

on the GaAs substrate, the following are epitaxially deposited: a stop layer of AlAs or of AlGaAs, a layer of GaAs, the layer of AlAs that is to be selectively oxidized, and a terminal layer of GaAs;

the InGaAsP terminal layer is removed by selective chemical etching before the heat treatment for epitaxial adhesion;

after the heat treatment for epitaxial adhesion, the GaAs substrate and the stop layer are removed by selective chemical etching; and the surface GaAs layer is etched so that the layer remaining at the surface of the sample between the mesas is the AlAs layer which is subsequently selectively oxidized.

10. A vertical cavity laser emission component emitting via a surface at an emission wavelength lying in the range from 1.3 $\mu$m to 1.55 $\mu$m, the component comprising:

a stack having two mirrors which reflect at the emission wavelength, said stack including following layers in succession on a N-doped GaAs substrate, a plurality of AlAs/GaAs layers defining a Bragg mirror;

a N-doped InP layer;

at least one layer which is interposed between the two mirrors and which constitute an amplifying medium for an emitted radiation, a P-doped InP layer; and a metal deposit;

wherein, in the vicinity of the amplifying medium, at least one of the mirrors presents a layer of $Al_xGa_{1-x}As$ where x lies in the range from 0.8 to 1, the layer being selectively oxidized around an active central zone of the amplifying medium, the layers between the oxidized layer and the metal deposit being etched into mesas.

11. The component according to claim 10, wherein the oxidized layer being the AlAs layer of the Bragg mirror closest to the amplifying medium.

12. A vertical cavity laser emission component emitting via a surface at an emission wavelength lying in the range from 1.3 $\mu$m to 1.55 $\mu$m, the component comprising:

a stack having two mirrors which reflect at the emission wavelength, said stack including following layers in succession on a N-doped InP substrate, a plurality of N type layers defining a Bragg mirror;

a N-doped InP layer;

at least one layer which is interposed between the two mirrors and which constitute an amplifying medium for an emitted radiation, a P-doped InP layer;

a P-doped GaAs layer;

a selectively oxidized layer of $Al_xGa_{1-x}As$ where x lies in the range from 0.8 to 1, the layer being selectively oxidized around an active central zone of the amplifying medium;

a P-doped GaAs layer etched into mesas; and a metal deposit.

13. A component according to claim 12, wherein the selectively oxidized layer includes AlAs.

* * * * *